(12) United States Patent
Breuch et al.

(10) Patent No.: US 6,906,498 B2
(45) Date of Patent: Jun. 14, 2005

(54) DEVICE AND METHOD FOR THE DETECTION OF A CHARGING VOLTAGE

(75) Inventors: Georg Breuch, Greven (DE); Zbigniew Kubacki, Emsdetten (DE)

(73) Assignee: Friwo Geraetebau GmbH (DE)

( * ) Notice: Subject to any disclaimer, the term of this patent is extended or adjusted under 35 U.S.C. 154(b) by 86 days.

(21) Appl. No.: 10/413,063

(22) Filed: Apr. 14, 2003

(65) Prior Publication Data

US 2003/0214268 A1 Nov. 20, 2003

(30) Foreign Application Priority Data

Apr. 15, 2002 (DE) .......................................... 102 16 642

(51) Int. Cl.[7] .................................................. H02J 7/04
(52) U.S. Cl. ..................................................... 320/145
(58) Field of Search ................................. 320/145, 148, 320/152, 156, 157, 160, 161, 162, 164, DIG. 21, 106; 324/433; 330/278

(56) References Cited

U.S. PATENT DOCUMENTS

| | | | | |
|---|---|---|---|---|
| 4,438,410 A | * | 3/1984 | Orne | 330/278 |
| 4,746,852 A | * | 5/1988 | Martin | 320/106 |
| 5,451,881 A | * | 9/1995 | Finger | 324/433 |
| 5,973,480 A | | 10/1999 | Takano et al. | 320/152 |

* cited by examiner

*Primary Examiner*—Pia Tibbits
(74) *Attorney, Agent, or Firm*—Michael Best & Friedrich LLP

(57) ABSTRACT

The present invention relates to a device and a method for the detection of a charging voltage of at least one rechargeable battery comprising a voltage converter for converting the charging voltage of the at least one rechargeable battery into a voltage signal, an analog/digital converter for converting the voltage signal of the voltage converter into a digital signal, and an evaluation and control device for evaluating the digital signal of the analog/digital converter as well as for controlling the charging process of the at least one rechargeable battery on the basis of the evaluation of the digital signal of the analog/digital converter. The voltage converter comprises an amplifier circuit with a variable gain controlled by at least one control output terminal of the evaluation and control device such that the gain applied for the generation of the voltage signal is adjusted to the input voltage range of the analog/digital converter according to a transfer function.

15 Claims, 8 Drawing Sheets

| 8-Bit-ADC | | 10-Bit-ADC | |
|---|---|---|---|
| | -ΔU [%] | | -ΔU [%] |
| 256 | 0,78 | 1024 | 0,195 |
| 200 | 1,00 | 800 | 0,250 |
| 150 | 1,50 | 600 | 0,333 |
| 100 | 2,00 | 400 | 0,500 |

(Output value arrows point to the 256 and 1024 columns)

Fig. 6

| | Cell number | Voltage situation | Output value 10-Bit-ADC | -ΔU [%] |
|---|---|---|---|---|
| 1 – 2 cells | n = 2 | 3,2V | 1024 | 0,195 |
| | n = 1 | 1,6V | 512 | 0,391 |
| 5 – 10 cells | n = 10 | 16V | 1024 | 0,195 |
| | n = 6 | 9,6V | 614 | 0,326 |
| | n = 5 | 8V | 512 | 0,391 |
| 5 – 15 cells | n = 15 | 24V | 1024 | 0,195 |
| | n = 9 | 14,4V | 614 | 0,326 |
| | n = 5 | 8V | 341 | 0,586 |

Fig. 7

| | Interval 1<br>(Switch 1-4 open)<br>15 cells | Interval 2<br>(S1 closed,<br>S2-4 open)<br>12 cells | Interval 3<br>(S1,2 closed,<br>S3-4 open)<br>10 cells | Interval 4<br>(S1-3 closed,<br>S4 open)<br>8 cells | Interval 5<br>(Switch 1-4 closed)<br>6 cells |
|---|---|---|---|---|---|
| $U_{11}=$ 24,0000 V | $U_{21}=$ 18,8252 V | $U_{31}=$ 14,7662 V | $U_{41}=$ 11,5824 V | $U_{51}=$ 9,0851 V |
| $U_{12}=U_{11}-\Delta U_1=$ 23,9280 V | $U_{22}=U_{21}-\Delta U_2=$ 18,7688 V | $U_{32}=U_{31}-\Delta U_3=$ 14,7219 V | $U_{42}=U_{41}-\Delta U_4=$ 11,5476 V | $U_{52}=U_{51}-\Delta U_5=$ 9,0578 V |
| $\Delta U_1=$ 72,00 mV | $\Delta U_2=$ 56,48 mV | $\Delta U_3=$ 44,30 mV | $\Delta U_4=$ 34,75 mV | $\Delta U_5=$ 27,26 mV |
| $\Delta_{max}=$ 0,300 % | $\Delta_{max}=$ 0,300 % | $\Delta_{max}=$ 0,300 % | $\Delta_{max}=$ 0,300 % | $\Delta_{max}=$ 0,300 % |
| $\Delta U_1/$cell 4,80 mV | $\Delta U_2/$cell 4,71 mV | $\Delta U_3/$cell 4,43 mV | $\Delta U_4/$cell 4,34 mV | $\Delta U_5/$cell 4,54 mV |
| $a_1=$ 0,5439 | $a_2=$ 0,6934 | $a_3=$ 0,8840 | $a_4=$ 1,1270 | $a_5=$ 1,4368 |
| $b_1=$ -8,0533 V | $b_2=$ -8,0533 V | $b_3=$ -8,0533 V | $b_4=$ -8,0533 V | $b_5=$ -8,0533 V |
| $U_{13}=$ 16,3698 V | $U_{23}=$ 12,8402 V | $U_{33}=$ 10,0716 V | $U_{43}=$ 7,9000 V | $U_{53}=$ 6,1967 V |
| $U_{14}=$ 16,2978 V | $U_{24}=$ 12,7837 V | $U_{34}=$ 10,0273 V | $U_{44}=$ 7,8653 V | $U_{54}=$ 6,1694 V |
| $\Delta U_1=$ 72,00 mV | $\Delta U_2=$ 56,48 mV | $\Delta U_3=$ 44,30 mV | $\Delta U_4=$ 34,75 mV | $\Delta U_5=$ 27,26 mV |
| $\Delta_{min}=$ 0,440 % | $\Delta_{min}=$ 0,440 % | $\Delta_{min}=$ 0,440 % | $\Delta_{min}=$ 0,440 % | $\Delta_{min}=$ 0,440 % |
| $\Delta U_1/$cell 6,55 mV | $\Delta U_2/$cell 6,28 mV | $\Delta U_3/$cell 6,33 mV | $\Delta U_4/$cell 6,95 mV | $\Delta U_5/$cell 6,81 mV |

Fig. 8

| | Interval 1 | Interval 2 | Interval 3 | Interval 4 | Interval 5 |
|---|---|---|---|---|---|
| | 15 cells | 12 cells | 10 cells | 8 cells | 6 cells |
| | PWM = 0,00 % | PWM = 16,74 % | PWM = 38,09 % | PWM = 65,30 % | PWM = 100,00 % |
| $U_{11}=$ 24,0000 V | $U_{21}=$ 18,8252 V | $U_{31}=$ 14,7662 V | $U_{41}=$ 11,5824 V | $U_{51}=$ 9,0851 V |
| $\Delta U_1=$ 72,00 mV | $\Delta U_2=$ 56,48 mV | $\Delta U_3=$ 44,30 mV | $\Delta U_4=$ 34,75 mV | $\Delta U_5=$ 27,26 mV |
| $\Delta_{max}=$ 0,300 % | $\Delta_{max}=$ 0,300 % | $\Delta_{max}=$ 0,300 % | $\Delta_{max}=$ 0,300 % | $\Delta_{max}=$ 0,300 % |
| $\Delta U_1/\text{cell}$ 4,80 mV | $\Delta U_2/\text{cell}$ 4,71 mV | $\Delta U_3/\text{cell}$ 4,43 mV | $\Delta U_4/\text{cell}$ 4,34 mV | $\Delta U_5/\text{cell}$ 4,54 mV |
| $a_1=$ 0,5439 | $a_2=$ 0,6934 | $a_3=$ 0,8840 | $a_4=$ 1,1270 | $a_5=$ 1,4368 |
| $U_{13}=$ 16,3698 V | $U_{23}=$ 12,8402 V | $U_{33}=$ 10,0716 V | $U_{43}=$ 7,9000 V | $U_{53}=$ 6,1967 V |

Fig. 9

DEVICE AND METHOD FOR THE DETECTION OF A CHARGING VOLTAGE

BACKGROUND OF THE INVENTION

1. Field of the Invention

The present invention relates to a device and a method for the detection of a charging voltage of at least one rechargeable battery.

2. Description of the Related Art

Due to their manifold advantages mobile terminals in the electric and entertainment industries become increasingly important. These devices depend on a location-independent power supply and, for reasons relating to the expenses therefor and to the environment, it is recommendable to use rechargeable batteries (hereinafter called accumulator). At the same time, there is an increasing need for inexpensive and compact accumulator chargers, as the terminals, too, are constantly manufactured smaller in size and more inexpensively. On the other hand, the chargers have to be reliable and flexible enough to guarantee a long service life of the accumulators, and they have to be capable of charging a variable number of rechargeable batteries at the same time.

In accumulator technology the most different methods are employed for detecting the charging state of an accumulator, such as the evaluation of the temperature or voltage gradient of the chargeable accumulator. A very exact method exploits the effect that the accumulator voltage is reduced when the charging process is continued after a maximum was obtained. This method is also designated with $\Delta U$ detection. FIG. 1 schematically shows both the temperature and the voltage curves of a 1.2V accumulator cell during a charging process. As illustrated, the temperature of the accumulator continuously increases with the charging time. The cell voltage likewise continuously increases with the charging time, however, only up to a maximum value. Afterwards it decreases despite the continued charging process.

Once the charging voltage has reached its maximum, the accumulator has been charged up to its maximum capacity. Any additional charging beyond this point signifies that the accumulator is overcharged and, thus, damaged. Therefore, it is important that the charging process be stopped, if possible immediately after the voltage maximum has been exceeded. This requires that the negative voltage change, also called $-\Delta U$, is exactly and reliably enough detected after the maximum value has been exceeded. With a cell voltage of 1.5V the value required therefor typically is 5 mV per cell or, expressed in percentage, typically 0.33% of the cell voltage.

In charging technologies the evaluation of the accumulator voltage and, thus, the detection of the $-\Delta U$ is typically performed with the aid of a microcontroller. The analog accumulator voltage is thereby supplied to an analog/digital converter (A/D converter) directly, or by means of a voltage divider, and is digitalized. For this purpose 8 bit or 10 bit A/D converters are commonly used.

For guaranteeing the necessary interference immunity when the negative voltage change $-\Delta U$ is measured by means of an A/D converter, only those signal changes are taken into account when the digital signals of the A/D converter are evaluated, that have a size of at least 2 LSB (Least Significant Bit). FIG. 6 shows, summarized in a table, the values of the maximum relative resolution of the voltage change $-\Delta U$ for both, an 8 bit A/D converter (8 bit ADC) and for a 10 bit A/D converter (10 bit ADC) with an evaluation exactness of 2 LSB. The values are issued for differently large digital output values of the A/D converters. The relative resolution with respect to smaller output values of the 8 bit A/D converter is clearly worse than the required typical 0.33%.

Relative to a definite number of accumulator cells the demand for accuracy in the $-\Delta U$ detection of at least 0.33% can, therefore, only be maintained by a 10 bit A/D converter, which is, however, clearly more expensive in comparison with an 8 bit A/D converter.

As the relative accuracy of larger voltages and, thus, in the upper range of the input voltage of the A/D converter is better, it should be made sure that the signal for the charging voltage of the accumulators or the accumulator package always ranges in the upper input voltage range of the A/D converter so as to achieve an as large as possible relative signal resolution.

If a variable number of accumulator cells is to be charged in one accumulator charger, e.g. 5 to 15 cells, a display of the voltage situation of the accumulator cells by a passive coupling, e.g. by a simple voltage divider, is no longer possible, if an accuracy in the $-\Delta U$ detection of 0.33% is to be achieved at the same time. FIG. 7 shows a table illustrating this fact by means of an example of a 10 bit A/D converter.

For obtaining even better resolutions in the $-\Delta U$ detection, microcontrollers and A/D converters having a higher resolution may be used.

Document U.S. Pat. No. 5,973,480 discloses that a microcomputer is used for setting a desired quotient of the accumulator cell voltage by additionally connecting resistors. A voltage division circuit divides the voltage range of the accumulator in correspondence with the measured range of the A/D converter downwardly. In view of a digital unit (1 LSB) of the 8 bit A/D converter this method results in an accuracy of 3.19 mV per accumulator cell.

SUMMARY OF THE INVENTION

It is an object of the present invention to provide a device for detecting the charging voltage of at least one rechargeable battery, which can be manufactured correspondingly flexibly, compact and inexpensively, as well as a corresponding method therefor.

According to the invention this object is provided by the subject matter of claims 1 and 13. Advantageous embodiments of the inventions are described in the dependent claims.

The present invention is based on the knowledge that, on one hand, complex analog circuits can be simplified by the use of modern evaluation and control devices, e.g. microcontrollers, and that, on the other hand, complicated and, thus, expensive evaluation and control devices can be replaced by essentially more inexpensive ones by using efficient and compact analog circuits.

Therefore, extremely compact, inexpensive chargers can be realized on the basis of the solution according to the invention, which, on one hand, can be used for one or more rechargeable batteries. On the other hand, the accuracy in the detection of the cell voltage according to the inventive solution allows the control of the charging process of the accumulator cells with such an exactness that the overcharge of the accumulator cells is reduced to a minimum, so that the service life of the accumulator cells is increased.

According to a preferred embodiment the voltage conversion circuit includes an operation amplifier circuit, in which the amplification range is controlled by resistors connected by the evaluation and control device. The evaluation and control device comprises a microcontroller or a programmable microprocessor with an analog/digital converter for converting the signal of the voltage conversion circuit and control output terminals for controlling the resistors of the amplifier circuit being integrated therein. The microcontroller or microprocessor is thereby formed of an 8 bit microcontroller or processor, and the A/D converter of an 8 bit A/D converter.

This compact circuit allows the flexible adjustment of the voltage signal of the accumulator cells to the input voltage range of the A/D converter during the charging process. This permits, on one hand, an exact detection of the accumulator cell voltage and, thus, a precise control of the charging process by means of an 8 bit microcontroller. On the other hand, this preferred embodiment permits, either with a minimum or a maximum number of accumulator cells to be charged, the detection of the maximum charging state of the batteries with an accuracy to such an extent that overcharging is avoided. The compact construction of the circuit allows space-saving and miniaturized embodiments of the present invention, which can moreover even be realized in an inexpensive manner due to the use of 8 bit microcontrollers.

If an overlapping of the gain ranges is provided in addition to the inventive solution, a continuous transition between the gain ranges is feasible without the occurrence of evaluation errors in the measurement of the accumulator cell voltage, which entails the faulty control of the charging process of the accumulator cells.

According to a particularly preferred embodiment the voltage conversion circuit comprises an operation amplifier circuit, in which the gain is controlled by a pulse width modulation circuit. The adjustment of the voltage signal of the voltage converter to the input voltage range of the A/D converter is effected by the range-wise as well as by the step-wise increase of the duty cycle of the pulse width modulation circuit.

This particularly preferred embodiment once more reduces the size of the circuitry in comparison with the already mentioned one, as one control output terminal is enough to control the gain of the control output terminal, which is preferably integrated in the evaluation and control device. An adjustment of the duty cycle of the pulse width modulation circuit step by step therefore additionally allows a nearly continuous gain, by which the accuracy of the detection of the accumulator cell voltage is once more improved.

The preferred field of application of the embodiments of the present invention is constituted by the field of modern charging mains power supplies.

BRIEF DESCRIPTION OF THE DRAWINGS

The accompanying drawings are incorporated into and form a part of the specification for the purpose of explaining the principles of the invention. The drawings are not to be construed as limiting the invention to only the illustrated and described examples of how the invention can be made and used. Further features and advantages will become apparent from the following, and more particular description of the invention as illustrated in the accompanying drawings, wherein:

FIG. 6 shows a table comprising a list of the maximum relative resolution of the voltage change $-\Delta U$ for an 8 bit A/D converter and a 10 bit A/D converter with an evaluated accuracy of 2 LSB, FIG. 7 shows a table comprising a list of the maximum relative resolution of the voltage change $-\Delta U$ for an 10 bit A/D converter with a different number of accumulator cells with an evaluated accuracy of 2 LSB, FIG. 8 shows a table comprising a survey of the ranges and characteristic quantities for the preferred embodiment of the present invention according to FIG. 3, FIG. 9 shows a table comprising a survey of the ranges and characteristic quantities for the particularly preferred embodiment of the present invention according to FIG. 5 as comparison over the survey of the ranges and their characteristic quantities of the preferred embodiment (FIG. 8)

DETAILED DESCRIPTION OF THE INVENTION

The illustrative embodiments of the present invention will be described with reference to the figure drawings, wherein like elements and structures are indicated with like reference numbers.

Figure 1:
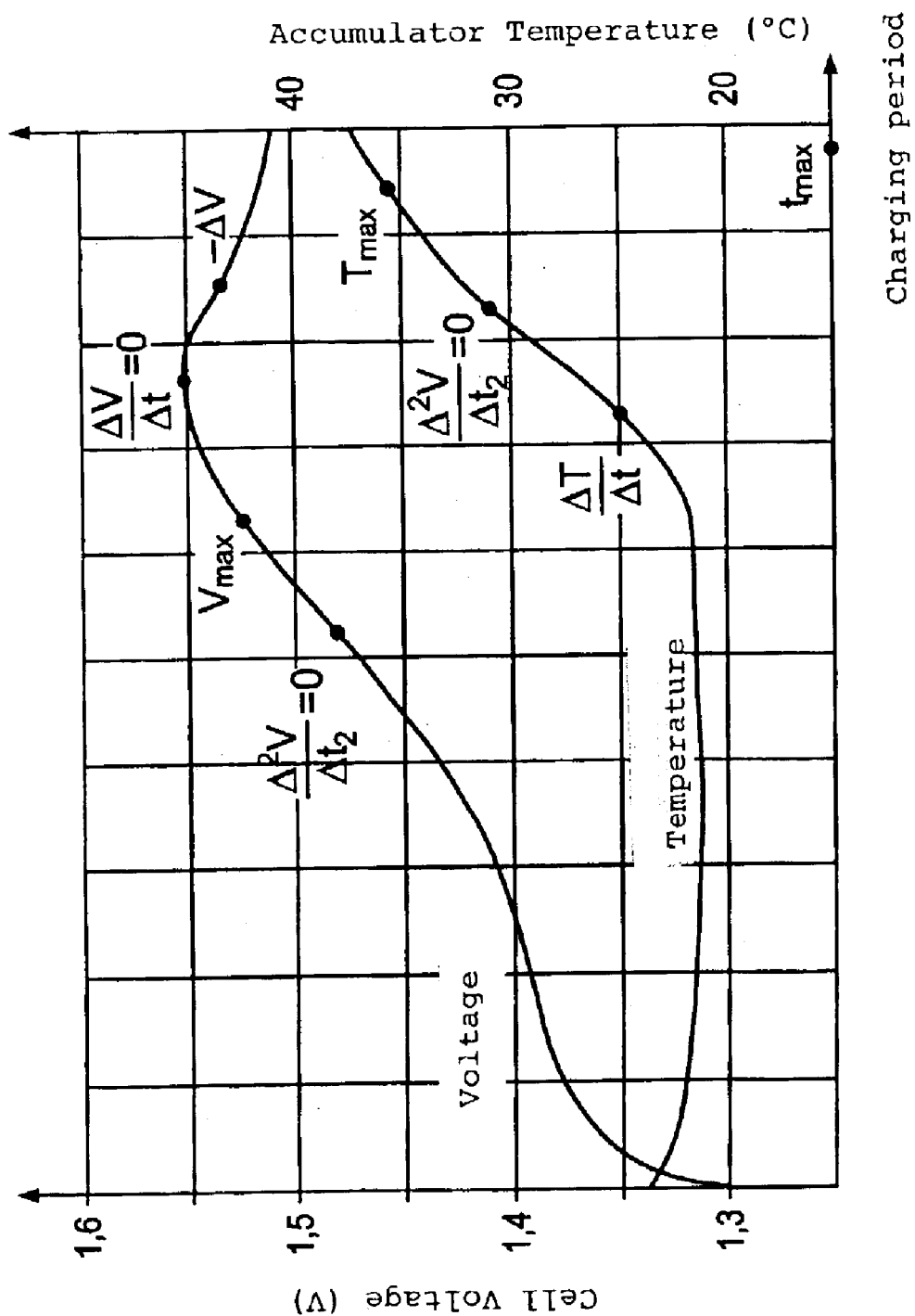
FIG. 1 shows a schematic illustration of the temperature and voltage curves of an 1.2V accumulator cell during the charging process.
Figure 2:
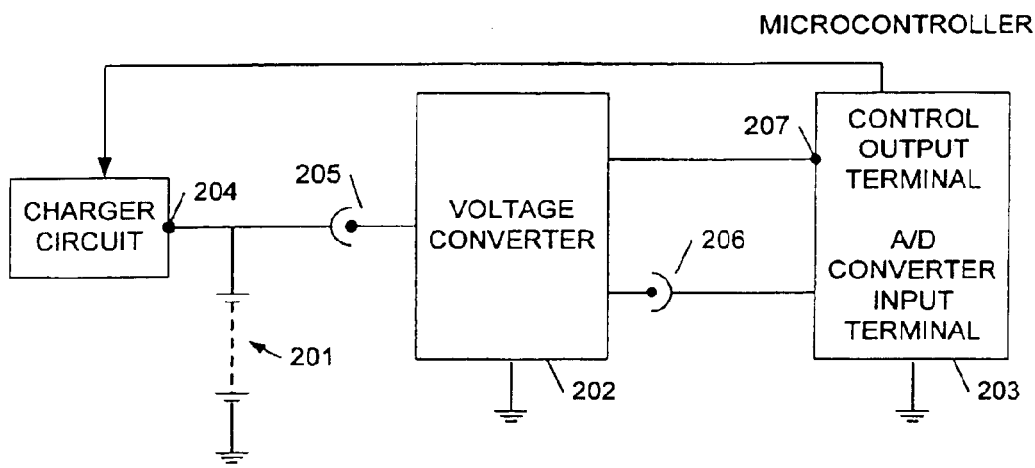
FIG. 2 shows a block diagram of a preferred embodiment of the present invention.

FIG. 2 shows, by means of a simple block diagram, a preferred embodiment of the present invention. The block diagram shows a block with accumulator cells 201, a voltage converter 202 and an evaluation and control device 203. In the present embodiment, an 8 bit microcontroller, in which the A/D converter is integrated, has been chosen as an inexpensive example for the evaluation and control device. Embodiments comprising the aforementioned features, in which a separate A/D converter or a different evaluation and control device are used, are also possible, however.

The accumulator cell block 201 comprises a terminal 204 for a charger for charging the accumulator cells and is connected to a voltage converter 202. Via an input terminal of the voltage converter the variable voltage 205 of the accumulator cells is sensed. At the output of the voltage converter a correspondingly transformed voltage signal 206 is applied at the input of the A/D converter. The A/D converter converts the voltage signal into a digital signal and transfers the same to a microcontroller for evaluation purposes. The microcontroller controls the voltage converter and the charging process via one or more control output terminals 207 in correspondence with the digital signals of the A/D converter output.

As an alternative to the 8 bit microcontroller also a suitable microprocessor, ASIC (Application Specific Integrated Circuit) or DSP (Digital Signal Processor) may be used as evaluation and control device 203.

Figure 3:
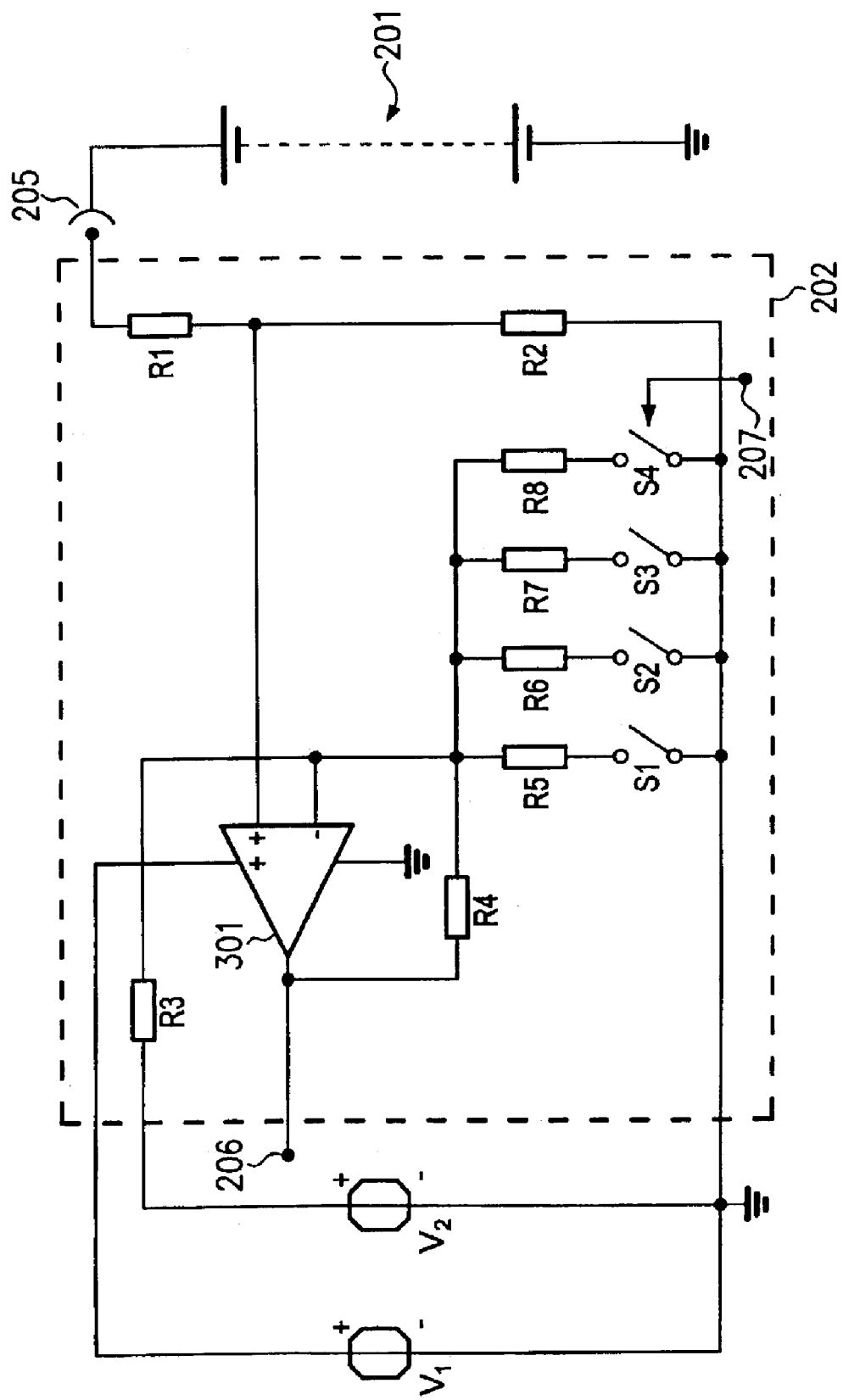
FIG. 3 shows a block diagram of a preferred embodiment of the operation amplifier circuit corresponding to the present invention.

FIG. 3 shows a schematic illustration of a preferred embodiment of an operation amplifier circuit of the present invention. The voltage 205 of the accumulator cells 201 is sensed via the input terminal of the voltage converter and is divided by the resistors R1 and R2. The so divided voltage signal of the accumulator cells is switched to the non-inverting input terminal of the operation amplifier 301, which is connected to a suitable voltage supply $V_1$. The inverting input terminal of the operation amplifier is, on one hand, connected with a positive voltage potential $V_2$ via a resistor R3, on the other hand, with an earth potential via resistors R5 to R8 and corresponding switches S1 to S4 and, thirdly, with the output terminal of the operation amplifier via a resistor R4. The switches S1 to 54 are connected with the control output terminals 207 of the microcontroller and are preferably realized by bipolar transistors or FET. However, also conventional switches may be used. Moreover, the circuit is not limited to a number of four resistors R5 to R8 and the corresponding switches 51 to 54, but can be reduced or expanded according to need and application. The voltage supplies $V_1$ and $V_2$ as well as the operation amplifier are provided on the same earth potential.

In the preferred embodiment of the amplifier circuit a potential is applied relative to the output terminal of the operation amplifier at the inverting input terminal of the operation amplifier via the voltage source $V_2$ and the resistors R3 and R4. The result of this circuit is a negative offset of the voltage at the output terminal of the operation amplifier, whereof the quantity is proportional to the quotient of the resistors R4 and R3. The amplification of the voltage signal applied at the non-inverting input terminal of the operation amplifier is set by the resistor R4 and the resistor array R5 to R8. The gain is thereby increased with the decreasing overall resistance of the resistor array R5 to R8. In dependence on the choice of the corresponding switches the gain of the operation amplifier can thus variably be adjusted by the resistors in the resistor array R5 to R8. As was mentioned already, the switches are thereby connected by the microcontroller 203.

The amplification of the voltage signal 205 applied at the input terminal of the voltage conversion circuit can be described with a transfer function, which has the form of a straight line equation, in which the axial portion is defined by the voltage of the voltage supply $V_2$ and the resistors R3 and R4. The gradient of the straight line results from the gain of the circuit, which is substantially defined by the resistors R1 and R2 as well as R4 and R5 to R8.

According to another embodiment of the present invention the resistor R3 is controlled by additional control output terminals of the microcontroller such that it changes its resistance value in a defined manner. This is preferably realized by a resistor array in analogy to the resistor array R5 to R8, or by similar circuits. Thus, it is possible to additionally vary the axial portion of the transfer function of the gain so as to expand the application field of the circuit.

In the block diagram shown in FIG. 3 all elements for the protective circuitry and the interference suppression have been omitted so as to not conceal the essential part of the present invention. The embodiments of the present invention can be expanded by protective diodes, filters and additional elements.

According to the preferred embodiment of the amplifier circuit the accumulator voltage is spread to the input range of an 8 bit A/D converter in a flexible, compact and exact manner, with a minimum of electronic components. For this purpose the gain of the amplifier circuit is preferably divided into different ranges. This means, in dependence on the voltage situation of the charging voltage of the accumulators, the transfer function of the operation amplifier is adjusted such that the projection of the voltage signal is always effected to the input voltage range of the A/D converter and that the required accuracy for the detection of the $-\Delta U$ is obtained. As was mentioned before, additionally connectable resistors serve for adjusting the accumulator voltage ranges. The number of the resistors and switches depends on the number of ranges required for covering the entire voltage range from the minimum to the maximum number of accumulators and for guaranteeing the corresponding sensitivity of the $-\Delta U$ detection. The narrower the individual ranges are defined, the more sensitive becomes the $-\Delta U$ evaluation. However, the interference sensibility increases as well.

The following exemplary calculation explains the above-mentioned method of the range classification for the gain by means of a maximum number of 15 accumulator cells. As further marginal conditions for the exemplary calculation it will be assumed in the following, that the voltage of a fully charged accumulator cell is 1.6V and that an 8 bit AID converter with an input voltage range of 0V to 5V is used. Moreover, the microcontroller takes into account only changes of at least 2 LSB in the $-\Delta U$ calculation, so as to have a large enough signal-to-interference ratio when evaluating the digital A/D signal. This corresponds to a change of the input voltage of the 8 bit A/D converter of 39.2 mV and may be described as in equation (1).

$$Res_{A/D} = \frac{(5-0.85) \text{ V}}{(256-44) \text{ Digit}} \cdot 2 \text{ Digit} = 39.2 \text{ mV} \tag{1}$$

The accuracy required in the $-\Delta U$ calculation amounts to 0.3%. The input voltage range of the 8 bit A/D converter of 0V to 5V will in the following exemplary calculation only be modulated in the voltage range of 0.85 V–5V ($U_{A/Din,min}$ or $U_{A/Din,max}$).

For guaranteeing a continuous transition between two ranges, the ranges are defined such that they overlap in the exemplary calculation by a predetermined percentage of 15%. Any other optional overlapping ranges are possible, however, The transfer function for each interval n is calculated from the solution of the following equations:

$$U_{A/Din,max} = U_{n1} \cdot a + b \tag{2}$$

$$(U_{A/Din,max} - Res_{A/D}) = U_{n2} \cdot a + b \tag{3}$$

$$\Delta U_n = U_{n1} - U_{n2} \quad n = 1,2,3,\ldots \tag{4}$$

$$\Delta_{max} = \frac{\Delta U_n}{U_{n1}} \qquad \Delta_{min} = \frac{\Delta U_n}{U_{n3}} \tag{5}$$

wherein $U_{n1}$ constitutes the upper and $U_{n3}$ the lower range limit of the interval n.

The general formula of the transfer function reads:

$$U_{A/Din}(U_{Akku}) = U_{Akku} \cdot a_n + b_n \tag{6}$$

wherein $U_{Akku}$ designates the accumulator or charging voltage 205, $a_n$ the gain and $b_n$ the offset voltage or also the axial portion of the transfer function $U_{A/Din}(U_{Akku})$. $U_{A/Din}(U_{Akku})$ corresponds to the voltage signal 206.

The gain $a_n$ can also be described as the quotient from the accumulator or charging voltage difference and input voltage range of the A/D converter in an interval n:

$$a_n = \frac{\Delta U_{Akku}}{\Delta U_{A/Din}} = \frac{Res_{A/D}}{\Delta U_n} \quad (7)$$

As initial value for the calculation of the ranges the highest accumulator voltage has to be selected. Accordingly, a voltage of 24 V for $U_{n1}$ is to be applied given 15 accumulator cells. Equation (4) represents the relation between the voltages $U_{n1}$ and $U_{n2}$, whereby a $\Delta_{max}$ having a value of 0.3% is to be obtained.

The lower limit of the interval can be calculated with the detected transfer function of $U_{A/Din,min}$. In this example, a first interval of 16.3 V to 24.0 V results therefrom, in which a maximum relative resolution of 0.3% voltage changes $\Delta_{max}$ can reliably be detected.

FIG. 8 shows a table with a survey of five gain ranges (interval 1–5), the characteristic quantities thereof and the calculated results for the preferred embodiment of the present invention according to FIG. 3.

As can be seen from the table, the reliably detectable voltage change (2 LSB) per accumulator cell even is under the demanded value of 5 mV per cell. Thus, this simple embodiment according to the present invention constitutes a clear improvement over existing solutions, especially since the circuit has a compact configuration.

The initial value for the next range results from the lower interval limit $\Delta U_{n3}$ of the preceding interval plus the pre-defined range overlapping of 15%. The calculation of the second interval takes place analogously to the calculation of the first interval. The calculation of the further intervals is continued until the minimum accumulator voltage is obtained.

Figure 4:
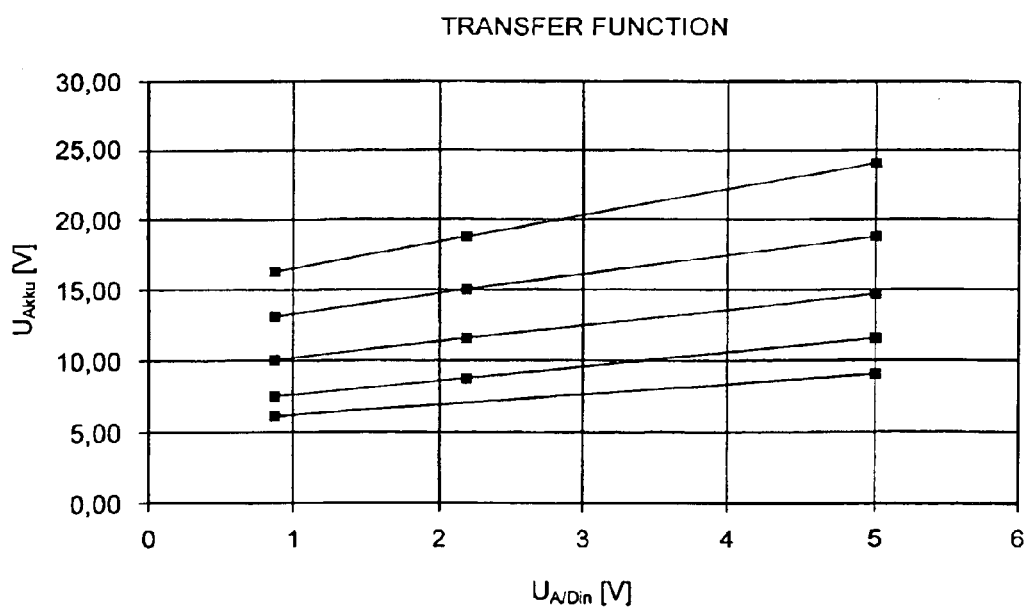
FIG. 4 shows a graphical illustration of the transfer functions of a preferred embodiment of the operation amplifier circuit corresponding to the present invention.

FIG. 4 shows, by way of a summary, the gradient of the reverse function of all transfer functions of the example. It can be recognized that the gradient 1/a of the straight line is reduced towards lower accumulator voltages, i.e. the gain of the operation amplifier circuit increases.

The control of the switches for setting the gain in the most different ranges is performed by the microcontroller by means of its programming. The microcontroller, therefore, has to be provided with at least as many output terminals as switches are required. As was already mentioned, the switches themselves can be realized preferably as bipolar transistor or FET. In this case, the resistors R5 to R8 are switched indirectly, i.e. by means of the external switches S1 to S4. Alternatively, the resistors R5 to R8 can be switched directly by using the control output terminals of the microcontroller, provided that open collector output terminals or similar control output terminals are integrated in the microcontroller.

For being able to determine the corresponding gain range in response to the number of accumulators to be charged, the microcontroller selects preferably the smallest gain and then detects the quantity of the current charging or accumulator voltage. On the basis of this value the microcontroller then selects the corresponding gain range. Hence, an A/D converter in the preferred embodiment is sufficient to automatically set the gain ranges.

Figure 5:
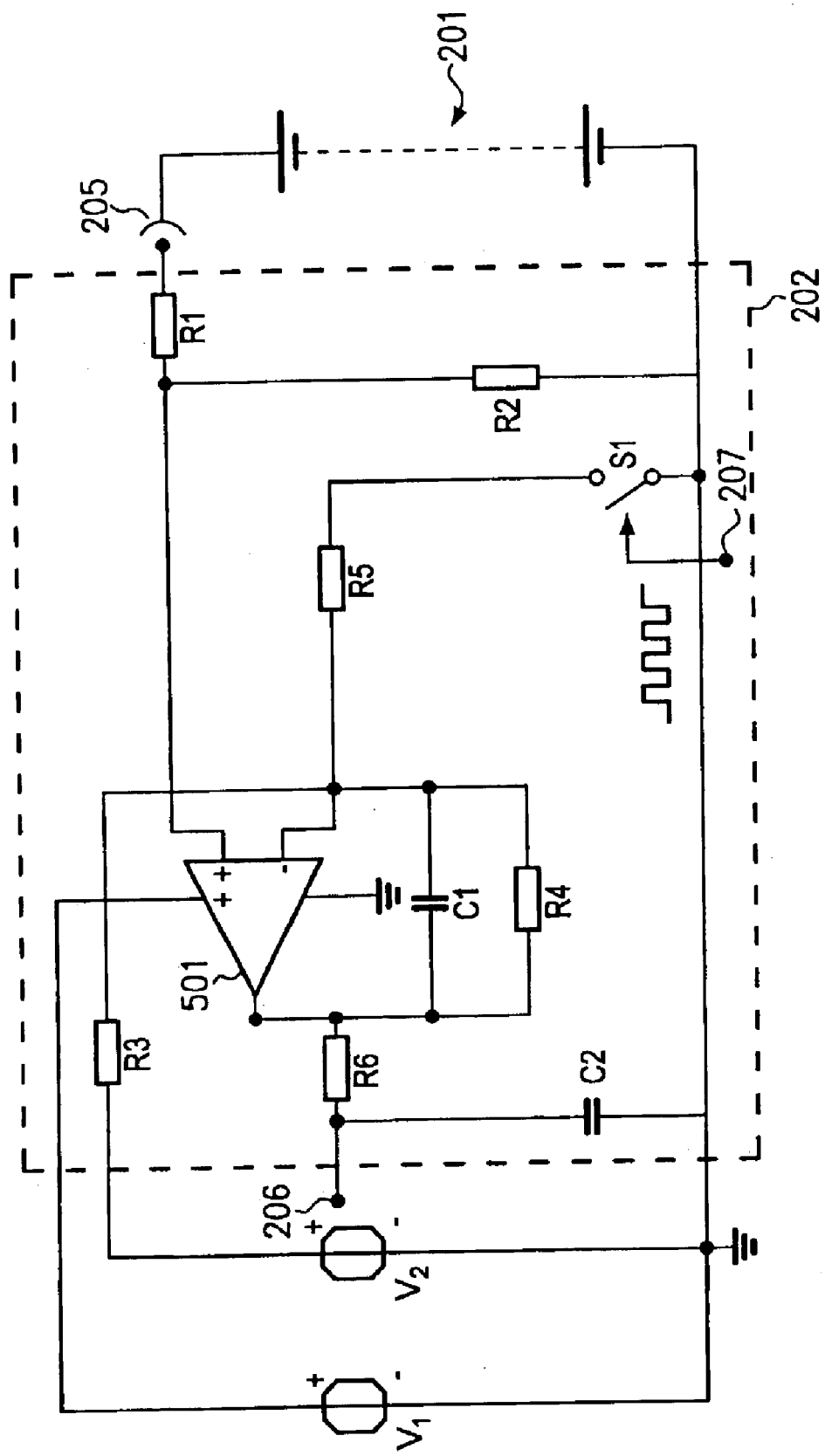
FIG. 5 shows a block diagram of a particularly preferred embodiment of the operation amplifier circuit corresponding to the present invention.

A particularly preferred embodiment of the present invention is formed by an operation amplifier circuit including pulse width modulation (PWM), as is illustrated as a block diagram in FIG. 5.

Like in the embodiment already illustrated in FIG. 3 here, too, the charging voltage 205 of the accumulator cells is sensed via the input terminal of the voltage converter, is divided by resistors R1 and R2 and is switched to the non-inverting input terminal of an operation amplifier 501.

The inverting input terminal of the operation amplifier is, on one hand, connected with a positive voltage potential $V_2$ by a resistor R3, on the other hand, with an earth potential by a resistor R5 and a switch S1 and, thirdly, with the output terminal 506 of the operation amplifier by a resistor R4. A capacitor C1 is connected in parallel to the resistor R4. A lowpass filter consisting of a resistor R6 and a capacitor C2 is connected between the output terminal 506 of the operation amplifier and the output terminal 206 of the voltage conversion circuit.

The switch S1 is connected with a control output terminal 207 of the microcontroller and is preferably realized by a bipolar transistor or FET. The switch S1 can also be realized by a conventional switch or an open collector output terminal of the microcontroller, provided that open collector output terminals or similar control output terminals are integrated in the microcontroller. In this case, the circuit is limited to a minimum of components, and the microcontroller only requires one single output terminal for controlling the gain.

Analogously to the other embodiments, the voltage supplies $V_1$ and $V_2$ as well as the operation amplifier are provided on the same earth potential.

The operating mode of this particularly preferred embodiment is in analogy to the previously described embodiment, with the difference that the gain of the operation amplifier is now set to be variable based on activation of switch S1 by a pulse width modulation signal.

There are two states in the static case: Switch S1 is closed or switch S1 is open. A closed switch S1 results in the maximum gain (cf. equation 7). In comparison with the multistage operation amplifier circuit described above, this corresponds to the case where all switches are closed. An open switch S1 results in the minimum gain, equal to interval 1 of the above-described embodiment. All intermediate values are obtained by the proportional activation, i.e. by a corresponding relation of the respective times for which the switch S1 is opened or closed. Thus, in response to the selection of this relation of the activation period to the activation and deactivation period (duty cycle), optional gains can be set.

This particularly preferred embodiment of the present invention is characterized not only by its compactness and, thus, inexpensive production, but also by a continuous adjustment of the signal of the accumulator charging voltage to the input range of the A/D converter.

The PWM method can also be applied to the example of the five gain ranges illustrated in FIG. 8, if a corresponding, constant duty cycle is chosen for each interval. FIG. 9 shows a table including a survey on the results for an analog calculation of five gain ranges (interval 1–5), the characteristic quantities thereof and the calculated results.

The results in FIG. 9 show that this particularly preferred embodiment also fulfils the accuracy of the aforementioned embodiment shown in FIG. 3.

For setting the optimum duty cycle and, thus, the gain, two different methods are preferably employed. On one hand, a measurement of the voltage situation of the accumulator can be effected by means of the microcontroller. The duty cycle is then set on the basis of this result. On the other hand, the output voltage 206 on the voltage converter can be adjusted by step-wise increasing the duty cycle such that a voltage of $U_{A/Din,min}$ is adjusted (see above).

The duty cycle is then preferably kept constant until the output voltage of the voltage converter during the charging process of the accumulators approaches the value $U_{A/Din,min}$ and the gain has to be adjusted to the following interval. This method approximately corresponds to the above-described step-wise method.

Since a plurality of intermediate values can be adjusted by means of the PWM method, it is possible to provide a very exact adjustment of the duty cycle and, thus, of the gain. Said plurality of intermediate values corresponds to a plurality of gain ranges, and is limited only by the accuracy of the microcontroller during the control of the duty cycle. Thus, during the PWM method, the gain is controlled such that the output voltage of the voltage converter always lies within that input range of the A/D converter, that is the optimal one under the aspect of the charging technique.

Figure 10:
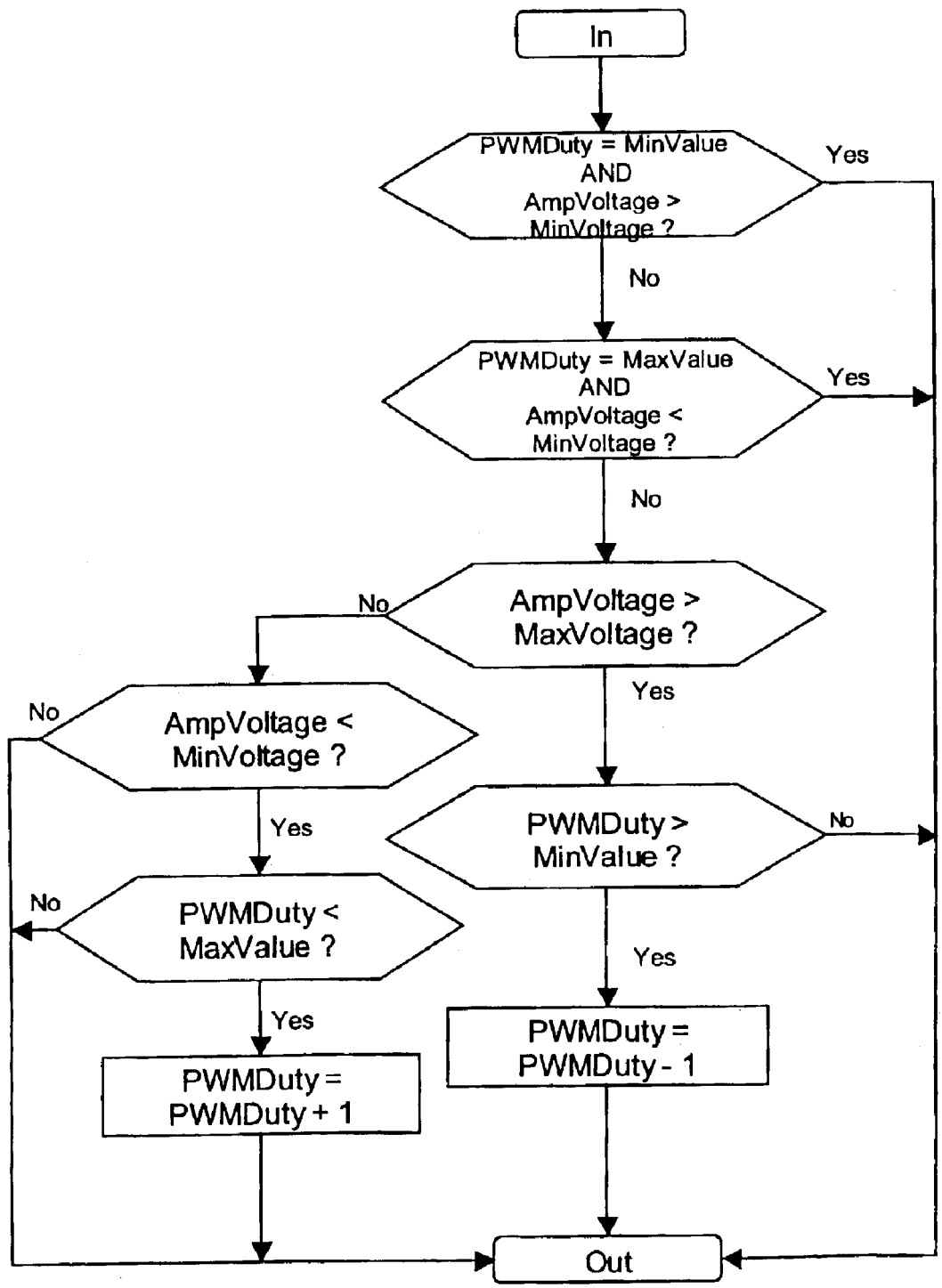
FIG. 10 shows a flow chart for controlling the pulse width modulation of the particularly preferred embodiment of the present invention according to FIG. 5.

FIG. 10 shows a flow chart for controlling the pulse width modulation (PWM) of the particularly preferred embodiment of the present invention according to FIG. 5. PWMDuty, MaxValue and MinValue thereby designate the current, the maximum and the minimum duty cycle of the PWM. AmpVoltage designates the output voltage of the voltage converter, MaxVoltage designates the maximum input voltage of the A/D converter $U_{A/Din,max}$ and MinVoltage the minimum input voltage of the A/D converter $U_{A/Din,min}$.

The course of a control sequence for setting the duty cycle of the PWM starts with the inquiry for the current duty cycle, the current output voltage and a comparison (step 1010) of both values with the respective minimum values. In correspondence with the evaluation result, the course is continued or stopped (step 1090). During the course of the control sequence the duty cycle of the PWM control is, according to the requirements, either increased (step 1080), reduced 8step 1050) or maintained (direct jump to step 1090).

The units for setting the duty cycle are thereby preferably changed in correspondence with the resolution of the control unit by 1 bit respectively. In an alternative embodiment of the control sequence the duty cycle is increased or reduced by a variable quantity, depending on the extent of the deviation of the currently measured values from the respective minimum or maximum values. The course of the control sequence is thereby cyclically repeated so as to adjust the gain of the voltage converter continuously. The time for the repetition of the control sequence is thereby preferably variably adjusted to the optimum course of the charging process, or is, alternatively, constant.

The control sequence described can also be used for the purpose that the evaluation and control unit 203 adjusts—under the aspect of the charging technique—the most favorable gain when the charging device is activated or, respectively, at the beginning of the charging process. This function is called "autorange" function and allows a flexible adjustment of the gain to the respective requirements, such as the number or the charging state of the accumulators.

By means of the PWM method including a plurality of intermediate values for the adjustment of the gain the sensitivity of the –ΔU detection can substantially be increased, and an even more reliable charging of the accumulators can be achieved simultaneously with an even longer service life of the accumulators.

In the aforementioned embodiment according to FIG. 3 this requirement for a higher sensitivity would result in more intervals. If, for example, the maximum sensitivity of 0.3% (–ΔU of=5 mV) should be improved to 0.2% (–ΔU of=3 mV), the number of intervals is increased from 5 to 12. Given a larger number of ranges in the above-mentioned embodiment, with a resistor array and corresponding switches, this would increase the size of the resistor array and the number of the required switches. By adjusting the duty cycle in the PWM method step by step the accuracy of the –ΔU detection can, however, be increased without increasing the size of the circuitry.

In the block diagram according to FIG. 5 all elements for the protective circuitry and the interference suppression have been omitted, so to not conceal the essential part of the present invention.

The above-described, particularly preferred embodiment of the present invention is varied, according to another embodiment, such that one or more of the resistors R1 to R5 are variably controlled by additional control output terminals of the microcontroller. Thus, the axial portion and the gradient of the transfer function (equation 6) of the gain is varied in a larger range, and the field of application of this particularly preferred embodiment is extended. This allows the construction of chargers which adjust their charging characteristics flexibly and "independently" to an optional number of accumulator cells or accumulator packages, and which have the required accuracy for controlling the charging process sufficiently exact.

While the invention has been described with respect to the physical embodiments constructed in accordance therewith, it will be apparent to those skilled in the art that various modifications, variations and improvements of the present invention may be made in the light of the above teachings and within in the purview of the appended claims without departing from the spirit and intended scope of the invention. In addition, those areas in which it is believed that those of ordinary skill in the art of familiar have not been described herein in order not to unnecessarily obscure the invention described herein. Accordingly, it is to be understood that the invention is not to be limited by the specific illustrative embodiments, but only by the scope of the appended claims.

What is claimed is:

1. Device for the detection of a charging voltage of a plurality of rechargeable batteries, the device comprising:

a voltage converter for converting the voltage of the rechargeable batteries into a voltage signal, an analog/digital converter for converting the voltage signal of the voltage converter into a digital signal, and an evaluation and control device for evaluating the digital signal of the analog/digital converter and for controlling the charging process of the at least one rechargeable battery based on the evaluation of the digital signal of the analog/digital converter, wherein the voltage converter comprises an amplifier circuit with a variable gain controlled by at least one control output terminal of the evaluation and control device such that the gain applied for the generation of the voltage signal is adjusted to an input voltage range of the analog/digital converter according to a transfer function, and wherein the evaluation and control device is adapted to define a number of ranges, each range having a gain to adjust the voltage signal of the voltage converter to the input voltage range of the analog/digital converter, the gain being determined by a maximum number of rechargeable batteries the device is capable to charge and a predetermined minimum accuracy for the conversion of the voltage signal of the voltage converter into a digital signal, the evaluation and control device adapted to adjust the transfer function of the amplifier circuit for each of the ranges based on the number of rechargeable batteries to be charged and the predetermined minimum accuracy.

2. Device for the detection of a charging voltage according to claim 1, characterized in that the amplifier circuit is formed of an operation amplifier circuit.

3. Device for the detection of a charging voltage according to claim 2, characterized in that the gain is controlled by resistors connected by the evaluation and control device.

4. Device for the detection of a charging voltage according to claim 3, characterized in that the ranges for the adjustment of the voltage signal of the voltage converter to the input voltage range of the analog/digital converter overlap so as to guarantee a continuous transition between two successive ranges.

5. Device for the detection of a charging voltage according to claim 3, characterized in that the adjustment of the voltage signal of the voltage converter to the input voltage range of the analog/digital converter takes place by the step-wise adjustment of the duty cycle of a pulse width modulation circuit such that the voltage signal is projected in a certain input voltage range of the analog/digital converter, so that a predetermined accuracy is guaranteed.

6. Device for the detection of a charging voltage according to claim 2, characterized in that the gain is controlled by means of pulse width modulation.

7. Device for the detection of a charging voltage according to claim 6, characterized in that the ranges for the adjustment of the voltage signal of the voltage converter to the input voltage range of the analog/digital converter overlap so as to guarantee a continuous transition between two successive ranges.

8. Device for the detection of a charging voltage according to claim 6, characterized in that the adjustment of the voltage signal of the voltage converter to the input voltage range of the analog/digital converter takes place by the step-wise adjustment of the duty cycle of the pulse width modulation circuit such that the voltage signal is projected in a certain input voltage range of the analog/digital converter, so that a predetermined accuracy is guaranteed.

9. Device for the detection of a charging voltage according to claim 1, characterized in that the evaluation and control device is formed of a microcontroller, a programmable microprocessor or an ASIC (Application Specific Integrated Circuit).

10. Device for the detection of a charging voltage according to claim 1, characterized in that the analog/digital converter is integrated in the evaluation and control device.

11. Device for the detection of a charging voltage according to claim 1, wherein the evaluation and control device includes a microcontroller and characterized in that the microcontroller includes at least one control output terminal by which the resistors or the pulse width modulation for the gain are connected directly or indirectly.

12. Device for the detection of a charging voltage according to claim 1, wherein the evaluation and control device includes a microcontroller and characterized in that the analog/digital converter is an 8 bit analog/digital converter and the microcontroller is an 8 bit microcontroller.

13. Charger comprising a circuit for detection of a charging voltage of a plurality of rechargeable batteries, the circuit comprising:

a voltage converter for converting the charging voltage of the rechargeable batteries into a voltage signal, an analog/digital converter for converting the voltage signal of the voltage converter into a digital signal, and an evaluation and control device for evaluating the digital signal of the analog/digital converter and for controlling the charging process of the at least one rechargeable battery based on the evaluation of the digital signal of the analog/digital converter, wherein the voltage converter comprises an amplifier circuit with a variable gain controlled by at least one control output terminal of the evaluation and control device such that the gain applied for the generation of the voltage signal is adjusted to an input voltage range of the analog/digital converter according to a transfer function, and wherein the evaluation and control device is adapted to define a number of ranges, each range having a gain to adjust the voltage signal of the voltage converter to the input voltage range of the analog/digital converter, the gain being determined by a maximum number of rechargeable batteries the device is capable to charge and a predetermined minimum accuracy for the conversion of the voltage signal of the voltage converter into a digital signal, the evaluation and control device adapted to adjust the transfer function of the amplifier circuit for each of the ranges based on the number of recharaeable batteries to be charged and the predetermined minimum accuracy.

14. Method of detecting a charging voltage of a plurality of rechargeable batteries, wherein the voltage of the rechargeable batteries is converted by means of a voltage converter into a voltage signal, the voltage signal of the voltage converter is converted by means of an analog/digital converter into a digital signal, and an evaluation and control device evaluates the digital signal of the analog/digital converter for controlling the charging process of the at least one rechargeable battery on the basis of the evaluation of the digital signal, wherein the gain of the voltage converter applied for the generation of the voltage signal is variably amplified by an amplifier circuit so as to adjust the voltage signal to the input voltage range of the analog/digital converter wherein the evaluation and control device is adapted to define a number of ranges, each range having a gain to adjust the voltage signal of the voltage converter to the input voltage range of the analog/digital converter the gain being determined by a maximum number of rechargeable batteries the device is capable to charge and a predetermined minimum accuracy for the conversion of the voltage signal of the voltage converter into a digital signal, the evaluation and control device adapted to adjust the transfer function of the amplifier circuit for each of the ranges based on the number of rechargeable batteries to be charged and the predetermined minimum accuracy.

15. Method of detecting the charging voltage according to claim 14, characterized in that the ranges for the adjustment of the voltage signal of the voltage converter to the input voltage range of the analog/digital converter overlap so as to guarantee a continuous transition between two successive ranges.

* * * * *

UNITED STATES PATENT AND TRADEMARK OFFICE
CERTIFICATE OF CORRECTION

PATENT NO. : 6,906,498 B2 Page 1 of 1
APPLICATION NO. : 10/413063
DATED : June 14, 2005
INVENTOR(S) : Georg Breuch and Zbigniew Kubacki It is certified that error appears in the above-identified patent and that said Letters Patent is hereby corrected as shown below:

In the Specification:

Column 5, line 12 - 54 should be "S4"

Column 5, line 17 - 54 should be "S4"

Column 5, line 17 - 51 should be "S1"

Column 6, line 20, AID should be "A/D"

Signed and Sealed this

Eighteenth Day of July, 2006

JON W. DUDAS
*Director of the United States Patent and Trademark Office*